United States Patent
Liu et al.

(10) Patent No.: US 10,886,846 B2
(45) Date of Patent: Jan. 5, 2021

(54) POWER CONVERTER WITH SWITCHING CONTROL

(71) Applicant: TEXAS INSTRUMENTS INCORPORATED, Dallas, TX (US)

(72) Inventors: Pei-Hsin Liu, Westford, MA (US); Richard Lee Valley, Nashua, NH (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 3 days.

(21) Appl. No.: 15/883,896

(22) Filed: Jan. 30, 2018

(65) Prior Publication Data

US 2019/0020277 A1 Jan. 17, 2019

Related U.S. Application Data

(60) Provisional application No. 62/533,322, filed on Jul. 17, 2017.

(51) Int. Cl.
| | |
|---|---|
| *H02M 3/157* | (2006.01) |
| *H03K 7/08* | (2006.01) |
| *G05F 1/575* | (2006.01) |
| *H01L 23/50* | (2006.01) |
| *H02M 1/36* | (2007.01) |
| *H02M 3/335* | (2006.01) |

(Continued)

(52) U.S. Cl.
CPC ............ *H02M 3/157* (2013.01); *G05F 1/575* (2013.01); *H01L 23/50* (2013.01); *H02M 1/36* (2013.01); *H02M 3/33507* (2013.01); *H03K 7/08* (2013.01); *H02M 7/5395* (2013.01); *H02M 2001/0012* (2013.01)

(58) Field of Classification Search
CPC ......... H02M 3/156–158; H02M 3/158; H02M 3/1584; H02M 3/1588; H02M 1/36; H02M 3/1585; H02M 3/33507; H02M 3/33515; H02M 3/33523; H02M 7/5395; H02M 2001/0012; H02M 2007/4815; H02M 2007/4818; Y02B 70/1466; G05F 1/575; H01L 23/50; H03K 7/08
USPC ....................................................... 363/21.02
See application file for complete search history.

(56) References Cited

U.S. PATENT DOCUMENTS

| | | | |
|---|---|---|---|
| 10,396,593 B1 * | 8/2019 | Judkins ................... H02J 3/383 |
| 2012/0320640 A1 * | 12/2012 | Baurle ............... H02M 3/33507 363/21.17 |
| 2015/0300312 A1 * | 10/2015 | Ferguson ................. F02P 5/15 123/406.12 |

* cited by examiner

*Primary Examiner* — Shawki S Ismail
*Assistant Examiner* — Monica Mata
(74) *Attorney, Agent, or Firm* — Mark Allen Valetti; Charles A. Brill; Frank D. Cimino (57) ABSTRACT

A power converter circuit includes a power stage comprising a transformer and a power switch. The power switch can be controlled in response to a PWM signal to provide a primary current through a primary winding of the transformer to induce a secondary current in a secondary winding of the transformer to generate an output voltage. The power stage includes a switching node having a switching voltage between the power switch and the primary winding. A switching controller includes a control transistor device to initiate an operational voltage associated with the control transistor device during a startup mode of the power converter circuit and to provide a control voltage based on an amplitude of the switching voltage during a normal operating mode. The switching controller generates the PWM signal in response to comparing the control voltage and a predetermined switching threshold voltage.

19 Claims, 3 Drawing Sheets

(51) Int. Cl.
*H02M 1/00* (2006.01)
*H02M 7/5395* (2006.01)

POWER CONVERTER WITH SWITCHING CONTROL

RELATED APPLICATIONS

This application claims priority from U.S. Provisional Application No. 62/533,322, filed 17 Jul. 2017, which is incorporated herein in its entirety.

TECHNICAL FIELD

This disclosure relates generally to electronic systems, and more specifically to a power converter with switching control.

BACKGROUND

Power converter circuits can be implemented in a variety of different ways. Examples of power converter circuits include synchronous rectifier power converters, asynchronous rectifier power converters, resonant power converters, and any of a variety of other types of switching power converters. The control circuitry for switching power converter circuits often uses comparators to sense the amplitude of a voltage, such as at a switching node, to activate the transistors at the correct times to provide current flow in the desired direction to produce DC voltages. The timing of switching can subject the power converter to power losses. As an example, the power converter can be subject to clamping losses based on diode-rectification and/or switching losses based on rectification with transistors (e.g., MOSFETs). Such losses can result in less efficiency in operation of the respective power converter.

SUMMARY

As one example, a power converter circuit includes a power stage comprising a transformer and a power switch. The power switch can be controlled in response to a PWM signal to provide a primary current through a primary winding of the transformer to induce a secondary current in a secondary winding of the transformer to generate an output voltage. The power stage includes a switching node having a switching voltage between the power switch and the primary winding. A switching controller includes a control transistor device to initiate an operational voltage associated with the control transistor device during a startup mode of the power converter circuit and to provide a control voltage based on an amplitude of the switching voltage during a normal operating mode. The switching controller generates the PWM signal in response to comparing the control voltage and a predetermined switching threshold voltage.

Another example includes a method for controlling a pulse-width modulation (PWM) signal for a power converter circuit. The method includes increasing an amplitude of an operational voltage of the power converter circuit via a control transistor device during a startup mode. The control transistor can be coupled to a switching node of a power stage. The method also includes generating a control voltage via the control transistor device during a normal operating mode to control a power switch of the power stage in response to the PWM signal to provide a primary current through a primary winding of the transformer. The switching node can have a switching voltage and can be arranged between the power switch and the primary winding. The method also includes monitoring a state of the PWM signal and clamping the control voltage via the control transistor device in response to a first state of the PWM signal. The method also includes closing a first switch in response to a second state of the PWM signal to provide the control voltage to a comparator. The method further includes comparing the amplitude of the control voltage with a predetermined switching threshold voltage via the comparator and controlling the PWM signal in response to the comparison.

Another example includes an integrated circuit (IC) chip comprising a power converter circuit. The power converter circuit includes a power stage comprising a transformer and a power switch. The power switch can be controlled in response to a pulse-width modulation (PWM) signal to provide a primary current through a primary winding of the transformer to induce a secondary current in a secondary winding of the transformer to generate an output voltage. The power stage includes a switching node having a switching voltage between the power switch and the primary winding. The system also includes a switching controller comprising a depletion-mode control transistor device coupled to the switching node and being coupled to generate a control voltage that is generated based on the switching voltage and that has an amplitude that is clamped at a predetermined clamping voltage. The switching controller can be coupled to generate the PWM signal based on the control voltage.

DETAILED DESCRIPTION

This disclosure relates generally to electronic systems, and more specifically to a power converter with switching control. The power converter can be implemented to generate an output voltage in response to an input voltage. As an example, the power converter can be configured as a flyback power converter. The power converter includes a gate driver stage that is configured to generate one or more switching signals in response to a respective at least one pulse-width modulation (PWM) signal. As an example, the gate driver can generate a first switching signal in response to a first PWM signal and a second switching signal in response to a second PWM signal. The power converter can also include a power stage. The power stage includes a transformer and at least one switch (e.g., transistor device) controlled by the switching signal(s) (e.g., first and second switching signals). As an example, the first switch can be activated via the first switching signal to provide a primary current through a primary winding of the transformer, such as from an input voltage to a low voltage rail (e.g., ground). The primary current can induce a secondary current in a secondary winding in an output stage to generate an output voltage (e.g., via a rectifier). The second switch can be activated via the second switching signal to circulate a magnetizing current associated with the transformer in a circuit path that includes an LC resonator.

In addition, the power converter includes a switching controller that is configured to generate the PWM signal(s) based on feedback from the power stage. As an example, the switching controller can include a comparator that is configured to generate the PWM signal in response to comparing the amplitude of a control voltage and a predetermined switching threshold voltage. Furthermore, the power converter can include a control transistor device that is coupled to a switching node and that is configured to initiate an operational voltage of the power converter circuit during a startup mode. The switching controller provides the control voltage based on an amplitude of a switching voltage that is associated with the switching node. As an example, the predetermined switching threshold voltage can have a very low amplitude (e.g., less than 1 volt), such that the comparison can provide the PWM signal to implement an approximate zero-volt switching (ZVS) of the first transistor device.

Figure 1:
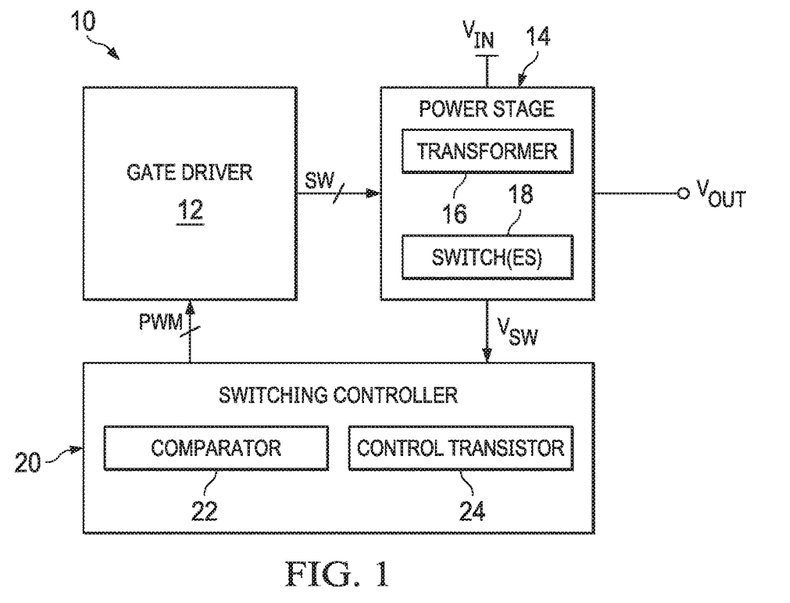
FIG. 1 illustrates an example of a power converter system.

FIG. 1 illustrates an example of a power converter system 10. The power converter system 10 is configured to convert an input voltage $V_{IN}$ (e.g., a DC input voltage) to a DC output voltage $V_{OUT}$. As an example, the power converter system 10 can be configured as a flyback power converter, as described in greater detail herein. The power converter system 10 can be implemented in any of a variety of electronic applications, such as in a portable electronic device, to provide efficient power conversion in generating the output voltage $V_{OUT}$. As an example, the power converter system 10, or at least a portion of the power converter system 10, can be implemented in an integrated circuit (IC) chip.

The power converter system 10 includes a gate driver 12 that is configured to generate at least one switching signal SW based on a respective at least one pulse-width modulation (PWM) signal PWM (hereinafter "signal PWM"). The switching signal(s) SW are provided to a power stage 14. In the example of FIG. 1, the power stage 14 includes a transformer 16 and at least one switch 18 that is controlled by the switching signal(s) SW. As an example, one of the switch(es) 18 can be activated via a respective switching signal SW to provide a primary current through a primary winding of the transformer 16. The primary current can induce a secondary current in a secondary winding of the transformer 16 to generate the output voltage $V_{OUT}$ (e.g., via a rectifier). As an example, the switch(es) 18 can include a second switch that can be activated via a respective second switching signal SW to circulate a magnetizing current associated with the transformer 16, such as via an LC resonator.

In the example of FIG. 1, the power stage 14 is configured to provide at least a switching voltage $V_{SW}$. As an example, the switching voltage $V_{SW}$ can be associated with the switch node coupled to at least one of the switch(es) 18. The power converter system 10 further includes a switching controller 20 that is configured to generate the signal(s) PWM that are provided to the gate driver 12, such as in response to the output voltage $V_{OUT}$. In the example of FIG. 1, the switching controller 20 includes a comparator 22 and a control transistor device 24.

The control transistor device 24 can be configured as a depletion-mode transistor device that is configured to generate a switching control voltage in response to the switching voltage associated with the switching node of one of the switch(es) 18. In addition, the control transistor device 24 can be implemented to provide a startup voltage for the switching controller 20 in a startup mode of the power converter system 10. As described herein, the term "startup mode" with respect to the power converter system 10 describes an initialization of the power converter system 10, such as in response to initial application of the input voltage $V_{IN}$ to the power converter system 10. The comparator 22 is configured to affect one of the signal(s) PWM based on a comparison of the switching control voltage and a predetermined switching threshold voltage. Thus, the signal PWM can provide control of the switch(es) 18 via the switching signal(s) SW. As an example, switching controller 20 can be configured to provide the signal PWM to implement zero-volt switching (ZVS) of one of the switch(es) 18 to substantially mitigate switching losses associated with the power converter system 10. As a result, the power converter system 10 can operate in a significantly efficient manner.

Figure 2:
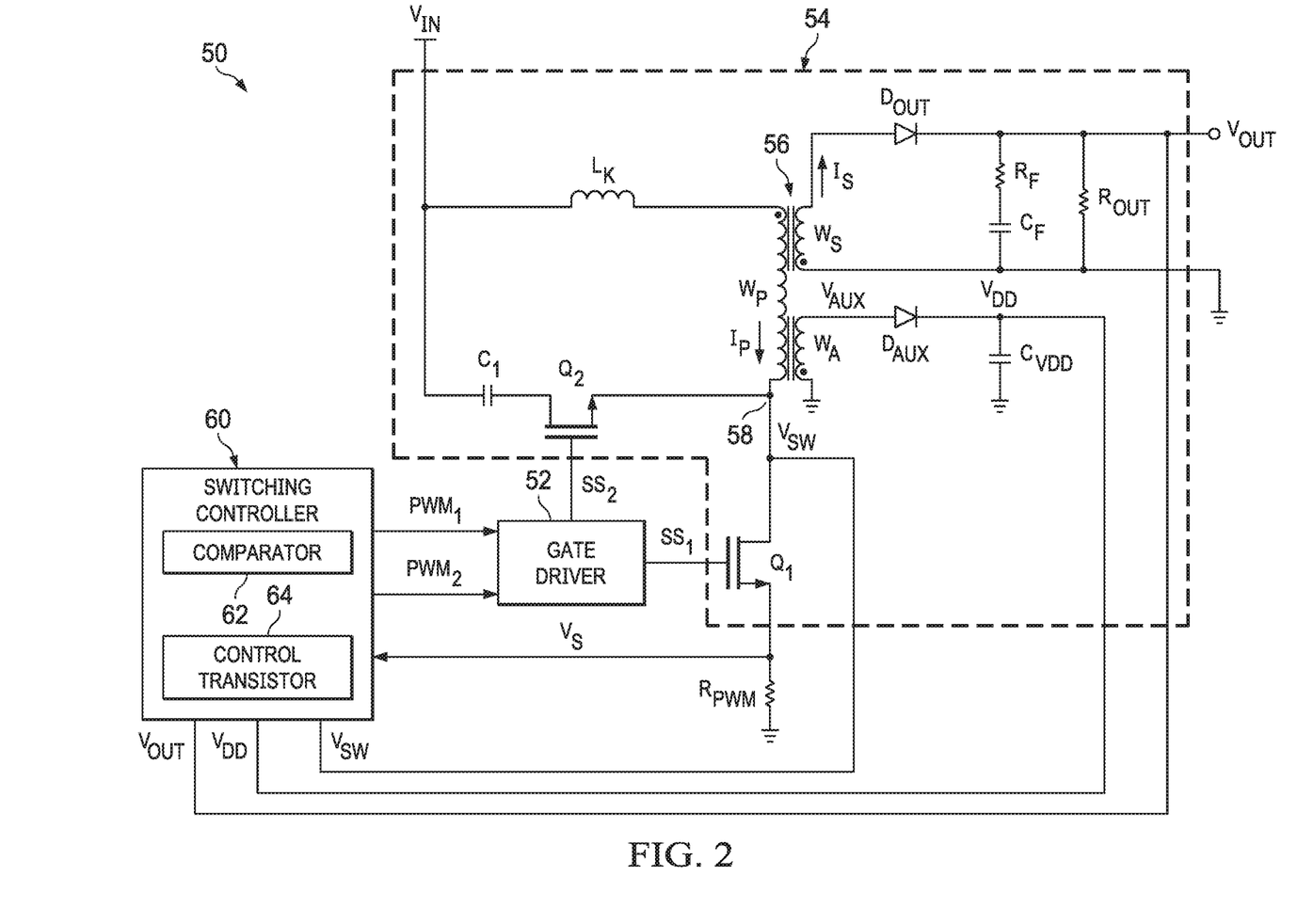
FIG. 2 illustrates an example of a power converter circuit.

FIG. 2 illustrates an example of a power converter circuit 50. The power converter circuit 50 is configured to convert a DC input voltage $V_{IN}$ (e.g., provided as a rectified AC input voltage) to a DC output voltage $V_{OUT}$. The power converter circuit 50 can be implemented in any of a variety of electronic applications, such as in a portable electronic device, to provide efficient power conversion in generating the output voltage $V_{OUT}$.

The power converter circuit 50 includes a gate driver 52 that is configured to generate a first switching signal $SS_1$ and a second switching signal $SS_2$ based on respective signals $PWM_1$ and $PWM_2$. The power converter circuit 50 also includes a power stage 54. The power stage 54 includes a transformer 56 having a primary winding $W_P$, a secondary winding $W_S$, and an auxiliary winding $W_A$. The power stage 54 also includes an input inductor $L_K$ corresponding to a leakage inductance of the transformer 56, a resonant capacitor $C_1$, and a pair of switches demonstrated in the example of FIG. 2 as a first N-channel field effect transistor device ("N-FET") $Q_1$ and a second N-FET $Q_2$. The N-FET $Q_1$ is controlled via the switching signal $SS_1$ and the N-FET $Q_2$ is controlled via the switching signal $SS_2$. The N-FETs $Q_1$ and $Q_2$ are coupled via a switching node 58.

During a first switching phase, the N-FET $Q_1$ is activated (e.g., with a gate-source voltage sufficient for initial saturation mode) via the first switching signal $SS_1$ to conduct a primary current $I_P$ from the input voltage $V_{IN}$ through the input inductor $L_K$, through the primary winding $W_P$, and through the N-FET $Q_1$ to a low-voltage rail (e.g., ground). In response, the primary current $I_P$ in the primary winding $W_P$ induces a secondary current Is in the secondary winding $W_S$ through an output diode $D_{OUT}$ to generate the output voltage $V_{OUT}$ across a load, demonstrated by a resistor $R_{OUT}$, and an output filter formed by a capacitor $C_F$ and a corresponding internal resistance $R_F$. Upon deactivation of the N-FET $Q_1$ via the first switching signal $SS_1$, during a second switching phase, the N-FET $Q_2$ is activated via the second switching signal $SW_2$ (e.g., after expiration of a predetermined deadtime) to, along with the secondary winding $W_S$, output voltage $V_{OUT}$, and rectifier, decay a magnetizing current $I_M$ that is a component of the primary winding current $I_P$ to approximately zero and furthermore to a reverse direction by the voltage of the resonant capacitor $C_1$, such that the negative magnetizing current ($I_{M-}$), following the deactivation of the N-FET $Q_2$, discharges the junction capacitance of the N-FET $Q_1$ and charges the junction capacitance of the N-FET $Q_2$. As the charge of the N-FET $Q_1$ is removed, the drain-to-source voltage of the N-FET $Q_1$ reduces to zero volts before activating the N-FET $Q_1$. As a result, the power converter circuit 50 can operate to efficiently reduce switching losses. During the activation time of the N-FET $Q_2$, the leakage inductance $L_K$ and the capacitor $C_1$ forms a resonant tank to circulate the leakage inductance $L_K$ energy to the output, such that clamping losses can also be efficiently reduced.

The power converter circuit 50 further includes a switching controller 60 that is configured to generate signals $PWM_1$ and $PWM_2$ that are provided to the gate driver 52. Thus, the gate driver 52 can generate the switching signals $SS_1$ and $SS_2$ based on the signals $PWM_1$ and $PWM_2$. For example, the gate driver 52 can generate the switching signal $SS_1$ based on the signal $PWM_1$ (e.g., based on the output voltage $V_{OUT}$) and can generate the switching signal $SS_2$ based on the signal $PWM_2$ (e.g., with a dead-time provided there-between). In the example of FIG. 2, the switching controller 60 is demonstrated as receiving an operational voltage $V_{DD}$ and a voltage $V_{SW}$. The switching controller 60 is thus configured to assert the signal $PWM_2$ in response to the voltages $V_{DD}$ and $V_{SW}$. The operational voltage $V_{DD}$ corresponds to an auxiliary voltage $V_{AUX}$ associated with the auxiliary winding $W_A$. In the example of FIG. 2, the auxiliary voltage $V_{AUX}$ is provided to an anode of a diode $D_{AUX}$ to generate the operational voltage $V_{DD}$ across a capacitor $C_{VDD}$. The voltage $V_{SW}$ corresponds to a switching voltage associated with the switching node 58.

In the example of FIG. 2, the switching controller 60 includes a comparator 62 and a control transistor device 64. As an example, the control transistor device 64 can be configured as a depletion-mode transistor device that is configured to generate a switching control voltage in response to the switching voltage $V_{SW}$. In addition, the control transistor device 64 can be implemented to provide a startup voltage for the switching controller 60 at initiation of the power converter circuit 50. The comparator 62 is configured to assert the signal $PWM_2$ based on a comparison of the switching control voltage and a predetermined switching threshold voltage. As an example, the power converter circuit 50 is configured to implement zero-volt switching of the N-FET $Q_1$, and thus to activate the N-FET $Q_1$ at approximately zero volts amplitude of the switching voltage $V_{SW}$ at the switching node 58.

Figure 3:
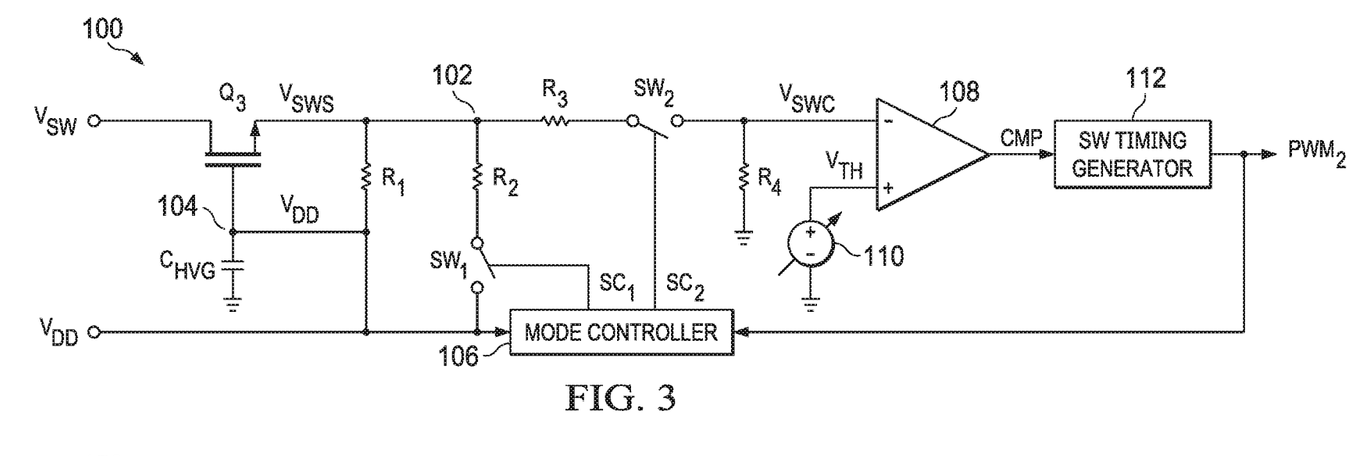
FIG. 3 illustrates an example of a switching controller.

FIG. 3 illustrates an example of a switching controller 100. The switching controller 100 can correspond to a portion of the switching controllers 20 and 60 in the respective examples of FIGS. 1 and 2. Therefore, reference is to be made to the examples of FIGS. 1 and 2 in the following description of the example of FIG. 3.

The switching controller 100 is configured to assert the signal $PWM_2$ based on the switching voltage $V_{SW}$ and the operational voltage $V_{DD}$ that are each provided from the power stage 54. The switching controller 100 includes a control transistor device $Q_3$ that is arranged to provide a control voltage $V_{SWS}$ at a node 102 in response to the switching voltage $V_{SW}$ that is provided from the switching node (e.g., the switching node 58). As an example, the control transistor device $Q_3$ can be arranged as a depletion-mode control transistor device, such that the control transistor device $Q_3$ can be activated initially in saturation mode to provide the control voltage $V_{SWS}$ based on the switching voltage $V_{SW}$ in response to a gate voltage that equal to (e.g., or slightly less than) an amplitude of the source voltage (e.g., the control voltage $V_{SWS}$). The control transistor device $Q_3$ has a control terminal (e.g., gate) that is coupled to a capacitor $C_{HVG}$ at a node 104 that is coupled to the node 102 via a resistor $R_1$. In the example of FIG. 3, the node 104 has the operational voltage $V_{DD}$ that controls the gate of the control transistor device $Q_3$.

The switching controller 100 also includes a mode controller 106 that is configured to monitor an amplitude of the operational voltage $V_{DD}$ and to generate switch control signals $SC_1$ and $SC_2$. As an example, during startup of the power converter circuit 50, the operational voltage $V_{DD}$ can increase to an acceptable amplitude for normal operation of the power converter circuit 50, as described in greater detail herein. Therefore, the mode controller 106 can provide the switch control signals $SC_1$ and $SC_2$ based on the amplitude of the operational voltage $V_{DD}$ to control the switching controller 100 in either a startup mode or a normal operating mode.

The switch control signal $SC_1$ is provided to activate a first switch $SW_1$ that interconnects the operational voltage $V_{DD}$ and a resistor $R_2$ that is coupled to the node 102. The switch control signal $SC_2$ is provided to activate a second switch $SW_2$ that interconnects a resistor $R_3$ that is coupled to the node 102 and an inverting input of a comparator 108 (e.g., corresponding to the comparators 22 and 62 in the respective examples of FIGS. 1 and 2) having a voltage $V_{SWC}$. A resistor $R_4$ interconnects the inverting input of the comparator 108 and a low-voltage rail (e.g., ground). The comparator 108 receives a predetermined switching threshold voltage $V_{TH}$ generated via a voltage source 110 at a non-inverting input, such that the comparator 108 is configured to generate a comparison signal CMP in response to comparing the voltage $V_{SWC}$ and the predetermined switching threshold voltage $V_{TH}$. The comparison signal CMP is provided to a timing generator 112 that is configured to control the signal $PWM_2$ based on the logic-state of the comparison signal CMP. The signal $PWM_2$ is provided to the gate driver 52, as described in the example of FIG. 2. Additionally, in the example of FIG. 3, the signal $PWM_2$ is also provided to the mode controller 106.

During a startup mode of the power converter circuit 50, the operational voltage $V_{DD}$ can have an amplitude that is less than an under-voltage lockout (UVLO) amplitude, such as having a predetermined amplitude that is stored in the mode controller 106. Thus, the mode controller 106 can be configured to compare the operational voltage $V_{DD}$ with the UVLO amplitude to determine whether the power converter circuit 50 is in the startup mode or the normal operating mode. In response to detecting that the operational voltage $V_{DD}$ is less than the UVLO amplitude (e.g., a first UVLO amplitude), the mode controller 106 can determine that the power converter circuit 50 is in the startup mode, and thus is required to build up a sufficient operating voltage condition (e.g., with respect to the operational voltage $V_{DD}$) before being able to provide the pulse-width modulated switching of the switches $Q_1$ and $Q_2$. In response to determining that the power converter circuit 50 is in the startup mode, the mode controller 106 can hold the second switch $SW_2$ in a deactivated (e.g., open) state via the switch control signal $SC_2$ and can hold the first switch $SW_1$ in an activated (e.g., closed) state via the switch control signal $SC_1$.

In the startup mode, the power stage 54 can receive the input voltage $V_{IN}$ to provide current through the primary winding $W_P$ of the transformer 56, which can thus provide the voltage $V_{SW}$ to the switching controller 100. The control transistor device $Q_3$ can thus operate as a current source to provide the control voltage $V_{SWS}$. As described previously, the control transistor device $Q_3$ can be configured as a depletion-mode control transistor device, and can thus be in an activated (e.g., initial saturation mode) state in response to an approximate zero amplitude gate voltage. Therefore, the control transistor device $Q_3$ can act as a current source during the startup mode to begin charging the capacitor $C_{HVG}$ via a current through the resistor $R_1$. As a result, the operational voltage $V_{DD}$ can begin to increase during the startup mode.

In response to the operational voltage $V_{DD}$ having an amplitude that is approximately equal to the UVLO amplitude (e.g., a first UVLO amplitude), the mode controller 106 can be configured to switch to the normal operating mode. As a result, the mode controller 106 can open the first switch $SW_1$ and hold the first switch $SW_1$ in a deactivated state via the switch control signal $SC_1$. Additionally, the mode controller 106 can further be configured to monitor the operational voltage $V_{DD}$ during the normal operating mode, such that the mode controller 106 can return the power converter circuit 50 back to the startup mode (e.g., by opening the switch $SW_2$ and by closing the switch $SW_1$) in response to the operational voltage $V_{DD}$ decreasing less than the UVLO amplitude. For example, the mode controller 106 can return the power converter circuit 50 to the startup mode in response to the operational voltage $V_{DD}$ decreasing less than a second UVLO amplitude that is less than the first UVLO amplitude corresponding to the threshold for the normal operating mode.

In the normal operating mode, as described previously, the switching controller 100 can assert the signal $PWM_2$ based on the amplitude of the switching voltage $V_{SW}$. As an example, the switching voltage $V_{SW}$ can have a high amplitude following the deactivation of the first switch $Q_1$. In response to the second switch $Q_2$ being deactivated, the switching node 58 can begin to resonantly transition downward, thus causing the switching voltage $V_{SW}$ to decrease. As an example, the power converter circuit 50 may be designed to implement zero-volt switching (ZVS) of the first switch $Q_1$, and thus to activate the first switch $Q_1$ at approximately a zero-volt amplitude of the switching voltage $V_{SW}$.

In the example of FIG. 3, during the normal operating mode, the operational voltage $V_{DD}$ has increased to an amplitude that is suitable for powering the electronics of the power converter circuit 50, such as the internal circuitry of the mode controller 106 (e.g., at an amplitude greater than the UVLO voltage amplitude). The amplitude of the operational voltage $V_{DD}$ provided at the gate of the control transistor device $Q_3$ can be such that the control transistor device $Q_3$ can be configured to provide clamping of the control voltage $V_{SWS}$ based on the amplitude of the voltage $V_{SW}$. In the example of FIG. 3, in response to the switching voltage $V_{SW}$ having an amplitude that is greater than a predetermined clamping threshold (e.g., the operational voltage $V_{DD}$ plus the deactivation threshold voltage of the control transistor device $Q_3$), the control transistor device $Q_3$ clamps the amplitude of the control voltage $V_{SWS}$ at approximately the predetermined clamping threshold based on the interconnection of the source and gate of the control transistor device $Q_3$ via the resistor $R_1$. Thus, when the switching voltage $V_{SW}$ has a high amplitude prior to activation of the first switch $Q_1$, the control voltage $V_{SWS}$ can be held at the clamped voltage amplitude.

As an example, the signal $PWM_2$ can be asserted to provide activation of the second switch $Q_2$ via the switching signal $SS_2$ and deactivation of the first switch $Q_1$ via the switching signal $SS_1$ via the gate driver 52. While the signal $PWM_2$ is asserted, the mode controller 106 can hold the switch $SW_2$ open via the switch control signal $SC_2$. As a result, the comparator 108 can be disabled from comparing the voltage $V_{SWC}$ and the predetermined switching threshold voltage $V_{TH}$. By disabling the comparator 108 from comparing the voltage $V_{SWC}$ and the predetermined switching threshold voltage $V_{TH}$, the switching controller 100 can operate more power efficiently by disabling the voltage-divider formed by the resistors $R_3$ and $R_4$ at a time that the comparator 108 is not required to compare the respective voltages $V_{SWC}$ and $V_{TH}$ based on the switching voltage $V_{SW}$ having a high amplitude resulting from the deactivated state of the first switch $Q_1$.

In response to the signal $PWM_2$ being de-asserted (e.g., based on a predetermined time set by the timing generator 112), the switching voltage $V_{SW}$ will begin to decrease. The rate and depth of the decrease of the switching voltage $V_{SW}$ can be a function of the primary winding current $I_P$ at the respective time. Additionally, the mode controller 106 can detect the de-assertion of the signal $PWM_2$, and can close the switch $SW_2$ via the switch control signal $SC_2$ to enable the comparator 108. In other words, the activation of the switch $SW_2$ can activate the voltage-divider formed by the resistors $R_3$ and $R_4$ to provide the amplitude of the voltage $V_{SWC}$ that is proportional to the amplitude of the control voltage $V_{SWS}$. As the switching voltage $V_{SW}$ decreases in amplitude, the control voltage $V_{SWS}$ remains clamped at the predetermined clamping threshold (e.g., the operational voltage $V_{DD}$ plus the deactivation threshold voltage of the control transistor device $Q_3$) until the switching voltage $V_{SW}$ decreases less than the predetermined threshold. In response, the control voltage $V_{SWS}$ can be provided at an amplitude that is approximately equal (e.g., tracks) the amplitude of the switching voltage $V_{SW}$.

In response to the voltage $V_{SWC}$ decreasing less than the predetermined switching threshold voltage $V_{TH}$, the comparator 108 can assert the comparison signal CMP that is provided to the timing generator 112. As a result, the timing generator 112 can modulate the timing of the PWM signals $PWM_1$ and $PWM_2$. In response, the state of the switching signals $SS_1$ and $SS_2$ can change to deactivate the second switch $Q_2$ and to activate the first switch $Q_1$. As an example, the predetermined switching threshold voltage $V_{TH}$ can be set to a very low amplitude (e.g., less than 1 volt), and the comparator 108 can be implemented with a predetermined offset. Accordingly, the comparator 108 can assert the comparison signal CMP at approximately zero volts of amplitude of the switching voltage $V_{SW}$ to provide ZVS switching of the power converter circuit 50 (e.g., with respect to deactivation of the second switch $Q_2$ and activation of the first switch $Q_1$). In response to assertion of the signal $PWM_2$, the mode controller 106 can open the switch $SW_2$ via the switch control signal $SC_2$, and the process of the normal operating mode can repeat as described previously. As a result, the timing generator 112 can continue to adjust a pulse-width of the signal $PWM_2$ until an approximate ZVS switching is achieved.

In the example of FIG. 3, the voltage source 110 is demonstrated as programmable. As an example, the voltage source 110 can be tunable to provide an adjustable amplitude of the predetermined switching threshold voltage $V_{TH}$. As a result, the power converter circuit 50 can operate in a partial-ZVS switching manner. For example, the first switch $Q_1$ can be configured as a super-junction metal-oxide semiconductor field-effect transistor (MOSFET), and can thus exhibit a highly non-linear junction capacitance. Therefore, the effects of the non-linear junction capacitance can be substantially mitigated based on switching the power converter circuit 50 (e.g., deactivating the first switch $Q_1$ and activating the switch $Q_2$) at an amplitude of the switching voltage $V_{SW}$ that is slightly greater than zero. As a result, conduction losses associated with the active clamp flyback operation of the power converter circuit 50 can be significantly mitigated.

Figure 4:
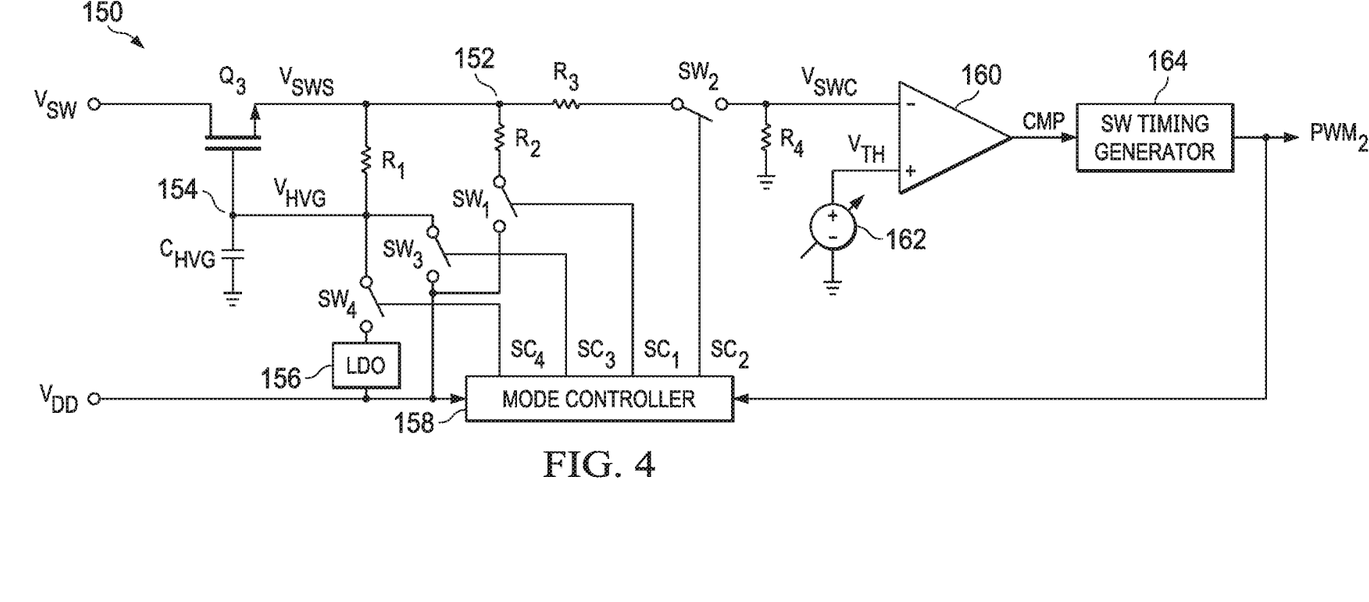
FIG. 4 illustrates another example of a switching controller.

FIG. 4 illustrates another example of a switching controller 150. The switching controller 150 can correspond to the switching controllers 20 and 60 in the respective examples of FIGS. 1 and 2. Therefore, reference is to be made to the examples of FIGS. 1 and 2 in the following description of the example of FIG. 4.

The switching controller 150 is arranged substantially similar to the switching controller 100 in the example of FIG. 3. For example, the switching controller 150 is configured to assert the signal $PWM_2$ based on the switching voltage $V_{SW}$ and the operational voltage $V_{DD}$ that are each provided from the power stage 54. The switching controller 150 includes a control transistor device $Q_3$ that is arranged to provide a control voltage $V_{SWS}$ at a node 152 in response to the switching voltage $V_{SW}$ that is provided from the switching node (e.g., the switching node 58). As an example, the control transistor device $Q_3$ can be arranged as a depletion-mode control transistor device, such that the control transistor device $Q_3$ can be activated in saturation mode to provide the control voltage $V_{SWS}$ based on the switching voltage $V_{SW}$ in response to a gate voltage that equal to (e.g., or slightly less than) an amplitude of the source voltage (e.g., the control voltage $V_{SWS}$). The control transistor device $Q_3$ has a gate that is coupled to a capacitor $C_{HVG}$ at a node 154 that is coupled to the node 152 via a resistor $R_1$.

Unlike the switching controller 100 in the example of FIG. 3, the switching controller 150 includes a low-dropout (LDO) voltage regulator 156 that interconnects the operational voltage $V_{DD}$ and the node 154, and also includes a third switch $SW_3$ and a fourth switch $SW_4$. In the example of FIG. 4, the node 154 has a voltage $V_{HVG}$ that is the gate voltage of the control transistor device $Q_3$. As an example, the LDO voltage regulator 156 regulates the amplitude of the voltage $V_{HVG}$ via the closed switch $SW_4$ during the normal operating mode based on the operational voltage $V_{DD}$ to substantially mitigate the effect of transients that can occur with respect to the operational voltage $V_{DD}$ with respect to the effects of the gate voltage of the control transistor device $Q_3$. As an example, by regulating the voltage $V_{HVG}$, the predetermined clamping voltage can be set to an approximately constant amplitude despite changes in the amplitude of the operational voltage $V_{DD}$. Accordingly, the predetermined clamping threshold can be set to a safe amplitude that can mitigate damage to the switching controller 150 resulting from a spurious increase in amplitude of the operational voltage $V_{DD}$ that could result in an unsafe amplitude of the control voltage $V_{SWS}$. Accordingly, the LDO voltage regulator 156 can ensure that the control voltage $V_{SWS}$ can be clamped at a safe amplitude that mitigates damage to the switching controller 150.

The switching controller 150 also includes a mode controller 158 that is configured to monitor an amplitude of the operational voltage $V_{DD}$ and to generate switch control signals $SC_1$, $SC_2$, $SC_3$, and $SC_4$. As an example, the mode controller 158 can operate similarly as described previously in the example of FIG. 3 to increase the operational voltage $V_{DD}$ during the startup mode and to provide selective enabling of a comparator 160 to compare the voltage $V_{SWC}$ with the predetermined switching threshold voltage $V_{TH}$, generated via a programmable or non-programmable voltage source 162, to generate a comparison signal CMP, as described herein.

Similar to as described previously, during a startup mode of the power converter circuit 50, the operational voltage $V_{DD}$ can have an amplitude that is less than a UVLO amplitude, such as having a predetermined amplitude that is stored in the mode controller 158. Thus, the mode controller 158 can be configured to compare the operational voltage $V_{DD}$ with the UVLO amplitude to determine whether the power converter circuit 50 is in the startup mode or the normal operating mode. In response to detecting that the operational voltage $V_{DD}$ is less than the UVLO amplitude (e.g., a first UVLO amplitude), the mode controller 158 can determine that the power converter circuit 50 is in the startup mode, and thus is required to build up a sufficient operating voltage condition (e.g., with respect to the operational voltage $V_{DD}$) before being able to provide the pulse-width modulated switching of the switches $Q_1$ and $Q_2$. In response to determining that the power converter circuit 50 is in the startup mode, the mode controller 158 can hold the second and fourth switches $SW_2$ and $SW_4$ in a deactivated (e.g., open) state via the respective switch control signals $SC_2$ and $SC_4$, and can hold the first and third switches $SW_1$ and $SW_3$ in an activated (e.g., closed) state via the respective switch control signals $SC_1$ and $SC_3$.

In the startup mode, the power stage 54 can receive the input voltage $V_{IN}$ to provide current through the primary winding $W_P$ of the transformer 56, which can thus provide the voltage $V_{SW}$ to the switching controller 150. The control transistor device $Q_3$ can thus operate as a current source to increase the control voltage $V_{SWS}$. As described previously, the control transistor device $Q_3$ can be configured as a depletion-mode control transistor device, and can thus be in an activated (e.g., initial saturation mode) state in response to an approximate zero amplitude gate voltage. Therefore, the control transistor device $Q_3$ can act as a current source during the startup mode to begin charging the capacitor $C_{HVG}$ and the additional capacitance associated with the operational voltage $V_{DD}$ (e.g., via the capacitor $C_{VDD}$ in the example of FIG. 2) via a current through the resistor $R_1$ and through the closed switches $SW_1$ and $SW_3$. As a result, the operational voltage $V_{DD}$ and the voltage $V_{HVG}$ can begin to increase during the startup mode.

In response to the operational voltage $V_{DD}$ having an amplitude that is approximately equal to the UVLO amplitude (e.g., a first UVLO amplitude), the mode controller 158 can be configured to switch to the normal operating mode. As a result, the mode controller 158 can open the first and third switches $SW_1$ and $SW_3$, and hold the first and third switches $SW_1$ and $SW_3$ in a deactivated state via the switch control signals $SC_1$ and $SC_3$. Additionally, the mode controller 158 can close the fourth switch $SW_4$ to facilitate regulation of the voltage $V_{HVG}$ via the operational voltage $V_{DD}$ via the LDO voltage regulator 156, as described previously. The mode controller 158 can further be configured to monitor the operational voltage $V_{DD}$ during the normal operating mode, such that the mode controller 158 can return the power converter circuit 50 back to the startup mode (e.g., by opening the switches $SW_2$ and $SW_4$ and by closing the switches $SW_1$ and $SW_3$) in response to the operational voltage $V_{DD}$ decreasing less than the UVLO amplitude. For example, the mode controller 158 can return the power converter circuit 50 to the startup mode in response to the operational voltage $V_{DD}$ decreasing less than a second UVLO amplitude that is less than the first UVLO amplitude corresponding to the threshold for the normal operating mode.

In the normal operating mode, as described previously, the switching controller 150 can assert the signal $PWM_2$ based on the amplitude of the switching voltage $V_{SW}$. As an example, the switching voltage $V_{SW}$ can have a high amplitude following the deactivation of the first switch $Q_1$. In response to the second switch $Q_2$ being deactivated, the switching node 58 can begin to resonantly transition downward, thus causing the switching voltage $V_{SW}$ to decrease. As an example, the power converter circuit 50 may be designed to implement ZVS of the first switch $Q_1$, and thus to activate the second switch $Q_1$ at approximately a zero-volt amplitude of the switching voltage $V_{SW}$.

In the example of FIG. 3, during the normal operating mode, the operational voltage $V_{DD}$ has increased to an amplitude that is suitable for powering the electronics of the power converter circuit 50, such as the internal circuitry of the mode controller 158 (e.g., at an amplitude greater than the UVLO voltage amplitude). The amplitude of the operational voltage $V_{DD}$ provided at the gate of the control transistor device $Q_3$ can be such that the control transistor device $Q_3$ can be configured to provide clamping of the control voltage $V_{SWS}$ based on the amplitude of the voltage $V_{SW}$. In the example of FIG. 3, in response to the switching voltage $V_{SW}$ having an amplitude that is greater than a predetermined clamping threshold (e.g., the operational voltage $V_{DD}$ plus the deactivation threshold voltage of the control transistor device $Q_3$), the control transistor device $Q_3$ clamps the amplitude of the control voltage $V_{SWS}$ at approximately the predetermined clamping threshold based on the interconnection of the source and gate of the control transistor device $Q_3$ via the resistor $R_1$. Thus, when the switching voltage $V_{SW}$ has a high amplitude prior to activation of the first switch $Q_1$, the control voltage $V_{SWS}$ can be held at the clamped voltage amplitude.

The comparison signal CMP is thus provided to a timing generator 164 that is configured to control the signal $PWM_2$ based on the logic-state of the comparison signal CMP. The signal $PWM_2$ is provided to the gate driver 52, as described in the example of FIG. 2, to generate the switching signals $SS_1$ and $SS_2$, similar to as described previously.

Figure 5:
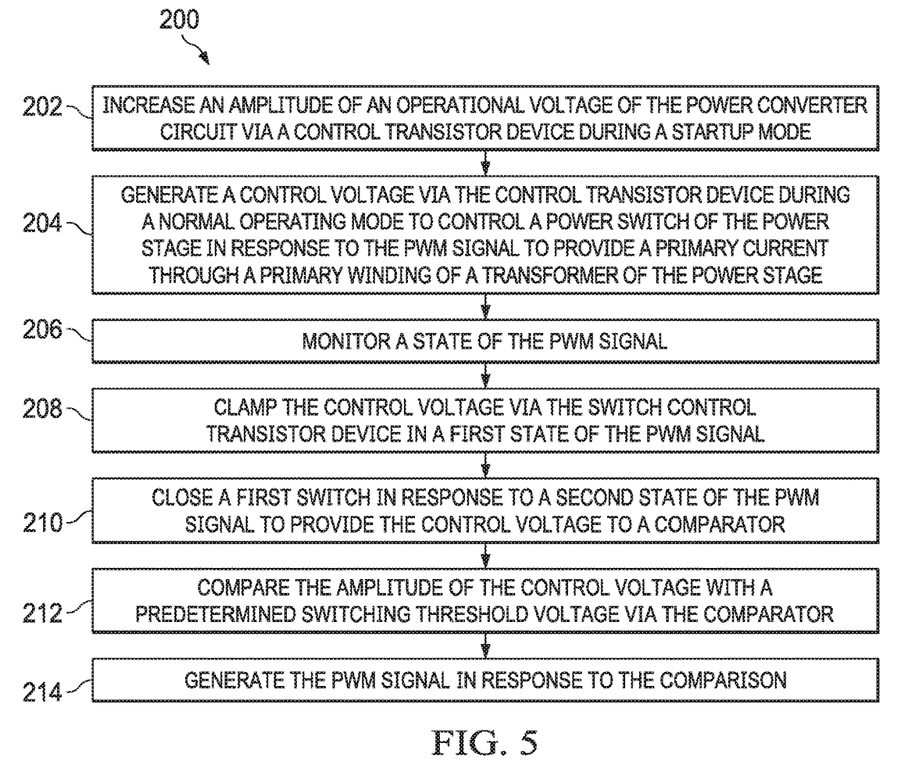
FIG. 5 illustrates an example of a method for controlling a pulse-width modulation (PWM) signal for a power converter circuit.

In view of the foregoing structural and functional features described above, a methodology in accordance with various aspects of the present invention will be better appreciated with reference to FIG. 5. While, for purposes of simplicity of explanation, the methodology of FIG. 5 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 5 illustrates an example of a method 200 for controlling a PWM signal (e.g., the signal $PWM_1$) for a power converter circuit (e.g., the power converter system 10). At 202, an amplitude of operational voltage (e.g., the operational voltage $V_{DD}$) of the power converter circuit is increased via a control transistor device (e.g., the control transistor device $Q_3$) during a startup mode. The control transistor can be coupled to a switching node (e.g., the switching node 58) of a power stage (e.g., the power stage 54). At 204, a control voltage (e.g., the control voltage $V_{SWS}$) is generated via a control transistor device during a normal operating mode to control a power switch (e.g., the first switch $Q_1$) of the power stage in response to the PWM signal to provide a primary current (e.g., the primary current $I_P$) through a primary winding (e.g., the primary winding $W_P$) of the transformer. The switching node can have a switching voltage (e.g., the switching voltage $V_{SW}$) and can be arranged between the power switch and the primary winding. At 206, a state of the PWM signal is monitored (e.g., via the mode controller 106). At 208, the control voltage is clamped via the control transistor device in a first state of the PWM signal. At 210, a first switch (e.g., the switch $SW_2$) is closed to provide the control voltage to a comparator (e.g., the comparator 108) in response to a second state of the PWM signal. At 212, the amplitude of the control voltage is compared with a predetermined switching threshold voltage (e.g., the predetermined switching threshold voltage $V_{TH}$) via the comparator. At 214, the PWM signal is generated based on the comparison.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A power converter circuit comprising:
   a power stage having an output operable to provide a primary current through a primary winding of a transformer in response to a pulse-width modulation (PWM) signal and to induce a secondary current in a secondary winding of the transformer to generate an output voltage, the power stage having a switching node at a switching voltage between a power switch and the primary winding; and
   a switching controller comprising a control transistor device, the control transistor device being coupled to the switching node to initiate an operational voltage associated with the control transistor device during a startup mode of the power converter circuit and to provide a control voltage based on an amplitude of the switching voltage during a normal operating mode, the switching controller being coupled to generate the PWM signal in response to comparing the amplitude of a signal based on the control voltage and a predetermined switching threshold voltage.

2. The circuit of claim 1, wherein the switching controller comprises a programmable voltage source coupled to provide the predetermined switching threshold voltage at a programmable amplitude.

3. The circuit of claim 1, wherein the control voltage has an amplitude that is approximately equal to the switching voltage and that is clamped in response to the amplitude of the switching voltage being greater than a predetermined clamping threshold.

4. The circuit of claim 3, wherein the control transistor device is a depletion-mode transistor device operable to clamp the control voltage at the predetermined clamping threshold.

5. The circuit of claim 4, wherein the transformer further comprises an auxiliary winding that is coupled to generate an auxiliary voltage in response to the primary current during the normal operating mode, the auxiliary winding coupled to set an amplitude of the operational voltage based on the auxiliary voltage.

6. The circuit of claim 5, further comprising an auxiliary capacitor coupled to the auxiliary winding, wherein the control transistor device is coupled to charge the auxiliary capacitor during the startup mode of the power converter circuit to set an initial amplitude of the operational voltage.

7. The circuit of claim 5, wherein the switching controller further comprises a low-dropout (LDO) power supply coupled to regulate a gate control voltage of the control transistor device based on the operational voltage at a predetermined amplitude in response to variations of the operational voltage.

8. The circuit of claim 1, wherein the switching controller further comprises a mode controller coupled to control operation of the switching controller in each of the startup mode and the normal operating mode of the power converter circuit via a plurality of switches.

9. The circuit of claim 8, wherein the mode controller is coupled to close a first of the plurality of switches during the startup mode to set the amplitude of the operational voltage by charging an auxiliary capacitor via the control voltage, wherein the mode controller is coupled to open the first of the plurality of switches to cease the startup mode to begin the normal operating mode in response to the operational voltage having an amplitude that is greater than or equal to a predetermined under-voltage lockout amplitude.

10. The circuit of claim 8, wherein the mode controller is coupled to close one of the plurality of switches in response to a first state of the PWM signal to provide the control voltage to a comparator to compare the control voltage and the predetermined switching threshold voltage to provide a second state of the PWM signal.

11. An integrated circuit (IC) chip comprising at least a portion of a power converter circuit, the power converter circuit comprising:
a power stage controlled in response to a pulse-width modulation (PWM) signal to provide a primary current through a primary winding of a transformer to induce a secondary current in a secondary winding of the transformer to generate an output voltage, the power stage comprising a switching node having a switching voltage between a power switch and the primary winding; and
a switching controller comprising a depletion-mode control transistor device coupled to the switching node and being coupled to generate a control voltage that is generated based on the switching voltage and that has an amplitude that is clamped at a predetermined clamping voltage, the switching controller being coupled to generate the PWM signal based on the control voltage.

12. The circuit of claim 11, wherein the switching controller comprises a comparator coupled to compare the amplitude of the control voltage and a predetermined switching threshold voltage, the switching controller controlling the PWM signal based on the comparison.

13. The circuit of claim 12, wherein the switching controller comprises a programmable voltage source coupled to provide the predetermined switching threshold voltage at a programmable amplitude.

14. The circuit of claim 11, wherein the transformer further comprises an auxiliary winding that is coupled to generate an auxiliary power voltage in response to the primary current during a normal operating mode, the auxiliary winding coupled to set an amplitude of an operational voltage based on the auxiliary power voltage, wherein the circuit further comprises an auxiliary capacitor coupled to the auxiliary winding, wherein the control transistor device is coupled to charge the auxiliary capacitor during a startup mode of the power converter circuit to set an initial amplitude of the operational voltage.

15. The circuit of claim 14, wherein the switching controller further comprises a low-dropout (LDO) power supply coupled to regulate a gate control voltage of the control transistor device based on the operational voltage at a predetermined amplitude in response to variations of the operational voltage.

16. A power converter circuit operable to provide a current to a primary winding of a transformer to induce a secondary current in a secondary winding of the transformer and an operational voltage at an auxiliary winding of the transformer, the power converter circuit comprising:
a power stage including:
a depletion-mode MOSFET having a first current terminal coupled to the primary winding of the transformer, a second current terminal coupled to ground and a control terminal; and
a switching node between the first current terminal and the primary winding of the transformer, the switching node at a switching voltage; and
a gate driver having an input and an output, the output of the gate driver coupled to the control terminal of the depletion-mode MOSFET; and
a switching controller including:
a control transistor having a first current terminal coupled to the switching node, a second current terminal and a control terminal of the control transistor coupled to the operational voltage; and
a comparator having an first input coupled to the second current terminal of the control transistor, a second input coupled to a switching threshold voltage and an output coupled to circuitry to provide a pulse-width modulation (PWM) signal.

17. The power converter circuit of claim 16, wherein the control transistor operates as a current source during startup.

18. The power converter circuit of claim 16, further including a capacitor coupled between the control terminal of the control transistor and ground.

19. The power converter circuit of claim 18, wherein the control transistor is operable to sense a soft switching condition.

* * * * *